United States Patent
Zhu

(10) Patent No.: US 9,847,438 B2
(45) Date of Patent: Dec. 19, 2017

(54) REDUCED CONTACT RESISTANCE AND IMPROVED LIFETIME OF SOLAR CELLS

(71) Applicant: SUNPOWER CORPORATION, San Jose, CA (US)

(72) Inventor: Xi Zhu, Milpitas, CA (US)

(73) Assignee: SunPower Corporation, San Jose, CA (US)

(*) Notice: Subject to any disclaimer, the term of this patent is extended or adjusted under 35 U.S.C. 154(b) by 560 days.

(21) Appl. No.: 14/211,161

(22) Filed: Mar. 14, 2014

(65) Prior Publication Data

US 2014/0261670 A1    Sep. 18, 2014

Related U.S. Application Data

(60) Provisional application No. 61/799,112, filed on Mar. 15, 2013.

(51) Int. Cl.
*H01L 31/0368* (2006.01)
*H01L 31/0224* (2006.01)
(Continued)

(52) U.S. Cl.
CPC ........... *H01L 31/022441* (2013.01); *H01L 31/022425* (2013.01); *H01L 31/0682* (2013.01); *H01L 31/1804* (2013.01); *Y02E 10/50* (2013.01)

(58) Field of Classification Search
CPC ......... H01L 31/022441; H01L 31/0682; H01L 31/182; H01L 31/068; H01L 31/0684;
(Continued)

(56) References Cited

U.S. PATENT DOCUMENTS 6,551,903 B1 * 4/2003 Shi .................. H01L 31/022425
257/E31.039
7,633,006 B1   12/2009 Swanson
(Continued)

FOREIGN PATENT DOCUMENTS

JP        11214717        8/1999

OTHER PUBLICATIONS

International Search Report and Written Opinion for International Application No. PCT/US2014/029594 dated Jul. 28, 2014, 9 pages.
(Continued)

*Primary Examiner* — Jeffrey T Barton
*Assistant Examiner* — Andrew Golden
(74) *Attorney, Agent, or Firm* — Schwabe, Williamson & Wyatt, P.C.

(57) ABSTRACT

A solar cell, having a front side which faces the sun during normal operation, and a back side opposite the front side can include a silicon substrate having doped regions and a polysilicon layer disposed over the doped regions. The solar cell can include a conductive filling formed between a first metal layer and doped regions and through or at least partially through the polysilicon layer, where the conductive filling electrically couples the first metal layer and the doped region. In an embodiment, a second metal layer is formed on the first metal layer, where the first metal layer and the conductive filling electrically couple the doped regions and the second metal layer. In some embodiments, the solar cell can be a front contact solar cell or a back contact solar cell.

13 Claims, 7 Drawing Sheets

(51) Int. Cl.
*H01L 31/068* (2012.01)
*H01L 31/18* (2006.01)

(58) Field of Classification Search
CPC ............ H01L 31/077; H01L 31/022425; H01L 31/022433; H01L 31/1804; H01L 31/1864
USPC .................................................. 136/243–265
See application file for complete search history.

(56) References Cited

U.S. PATENT DOCUMENTS

| | | | |
|---|---|---|---|
| 2008/0072953 A1* | 3/2008 | Stephens | H01L 31/0682 136/249 |
| 2009/0288704 A1 | 11/2009 | Borden | |
| 2011/0126898 A1* | 6/2011 | Harley | H01L 31/0682 136/256 |
| 2012/0060908 A1* | 3/2012 | Crafts | H01L 31/022425 136/255 |
| 2012/0266951 A1 | 10/2012 | Li et al. | |
| 2012/0276685 A1 | 11/2012 | Smith | |
| 2012/0322199 A1* | 12/2012 | Graff | H01L 31/0682 438/97 |

OTHER PUBLICATIONS

International Preliminary Report for International Application No. PCT/US2014/029594 dated Sep. 24, 2015, 6 pages.

\* cited by examiner ued States Patent US 9,847,438 B2

REDUCED CONTACT RESISTANCE AND IMPROVED LIFETIME OF SOLAR CELLS

CROSS REFERENCE TO RELATED APPLICATIONS

This application claims the benefit of U.S. Provisional Application No. 61/799,112 filed Mar. 15, 2013, entitled "STRUCTURES AND METHODS FOR IMPROVING ELECTRICAL PROPERTIES OF SOLAR CELLS", the entire contents of which are hereby incorporated by reference.

BACKGROUND

Photovoltaic (PV) cells, commonly known as solar cells, are well known devices for conversion of solar radiation into electrical energy. Generally, solar radiation impinging on the surface of, and entering into, the substrate of a solar cell creates electron and hole pairs in the bulk of the substrate. The electron and hole pairs migrate to p-doped and n-doped regions in the substrate, thereby creating a voltage differential between the doped regions. The doped regions are connected to the conductive regions on the solar cell to direct an electrical current from the cell to an external circuit. When PV cells are combined in an array such as a PV module, the electrical energy collected from all of the PV cells can be combined in series and parallel arrangements to provide power with a certain voltage and current.

Improved techniques for contact formation and plating metal to a solar cell may reduce fabrication operations and improve overall output yield, decreasing overall solar cell manufacturing time and increasing the available product yield.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
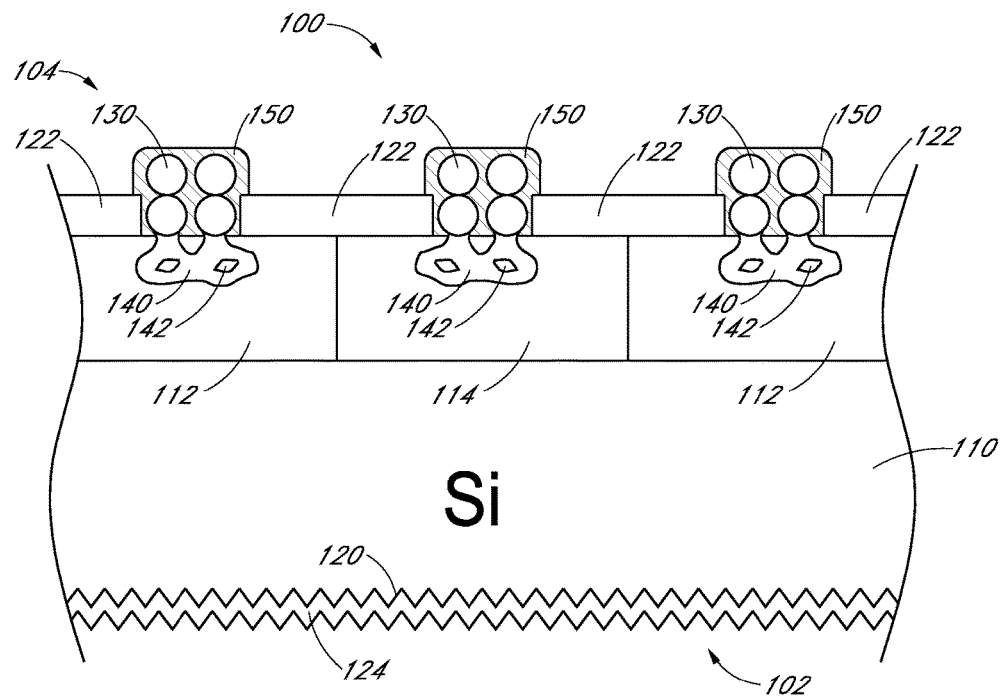
FIG. 1 illustrates a cross-sectional view of an example solar cell, according to some embodiments.

The following detailed description is merely illustrative in nature and is not intended to limit the embodiments of the subject matter of the application or uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. §112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" dielectric does not necessarily imply that this dielectric is the first dielectric in a sequence; instead the term "first" is used to differentiate this dielectric from another dielectric (e.g., a "second" dielectric).

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

"Layer." As used herein, layer can be a continuous region, or can be a region with holes and/or gaps and/or a region that does not cover the full length and/or width of the solar cell.

In the following description, numerous specific details are set forth, such as specific operations, in order to provide a thorough understanding of embodiments of the present disclosure. It will be apparent to one skilled in the art that embodiments of the present disclosure may be practiced without these specific details. In other instances, well-known techniques are not described in detail in order to not unnecessarily obscure embodiments of the present disclosure.

This specification first describes example solar cells that can include the disclosed contact regions, followed by a description of an example method for forming the disclosed contacts regions. A more detailed explanation of various embodiments of contact regions are provided throughout.

Turning now to FIG. 1, a solar cell 100 having a front side 102 which faces the sun during normal operation and a back side 104 opposite the front side 102 is illustrated. The solar cell 100 can include a silicon substrate 110 having first and second doped regions 112, 114. The silicon substrate can be cleaned, polished, planarized, and/or thinned or otherwise processed. In an embodiment, the silicon substrate 110 is polysilicon or multi-crystalline silicon.

In an embodiment, the first and second doped regions 112, 114 can be grown by a thermal process. In an embodiment, the first and second doped regions 112, 114 can be formed by depositing dopants in the silicon substrate by a conventional doping process. The first and second doped regions 112, 114 can each include a doping material but is not limited to a positive-type dopant such as boron and a negative-type dopant such as phosphorous. Although both the first and second doped regions 112, 114 are described as being grown through a thermal process, as with any other formation, deposition, or growth process operation described or recited here, each layer or substance is formed using any appropriate process. For example, a chemical vapor deposition (CVD) process, low-pressure CVD (LP-CVD), atmospheric pressure CVD (APCVD), plasma-enhanced CVD (PECVD), thermal growth, sputtering, as well as any other desired technique is used where formation is described. The first and second doped regions 112, 114 can be formed on the silicon substrate 110 by a deposition technique, sputter, or print process, such as inkjet printing or screen printing.

In an embodiment, an oxide layer can be deposited over the first and second doped regions 112, 114 serving as a protective barrier for both regions. A first dielectric layer 122 can be formed over the first and second doped regions 112, 114. In an embodiment, the first and second dielectric layer 112, 114 can include silicon nitride.

The solar cell 100 can include a texturized surface 120 for additional light absorption and a second dielectric layer 124 formed over the texturized surface 120. In some embodiments, both the first and second dielectric layer 122, 124 can include anti-reflective coatings. The texturized surface 120 can be one which has a regular or irregular shaped surface for scattering incoming light, decreasing the amount of light reflected back off the surface of the solar cell 100. In an embodiment, both the first and second dielectric layers 122, 124 can include an anti-reflective coating (ARC) on the front side 102 or a back anti-reflective coating (BARC) on the back side 104.

A first metal layer can be formed through contact regions over the first and second doped regions 112, 114. In an embodiment, the first metal layer can be formed by depositing a first metal paste that includes metal particles 130 and subsequently heating that first metal paste. In some embodiments, the metal particles 130 are aluminum particles. During the heating the metal particles 130 can react with the silicon of the first and second doped regions 112, 114 forming damaged regions 140 on the doped regions. The reaction between the aluminum and the silicon, the aluminum-silicon reaction can cause pits 142 to form. These pits 142 can be detrimental to the lifetime of charge carriers of the solar cell 100, degrading the overall solar cell performance.

In some embodiments, a second metal layer 150 can be formed on the first metal layer using a standard plating process. In some embodiments, the solar cell 100 can include a solar cell such as but not limited to, a back contact solar cell, a front-contact solar cell, a monocrystalline silicon solar cell, a polycrystialline silicon solar cell and/or an amorphous silicon solar cell.

Figure 2:
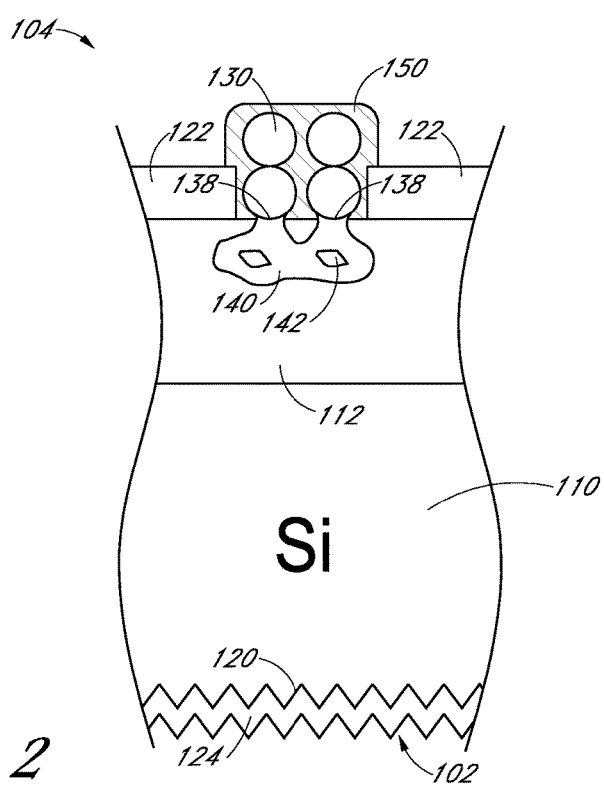
FIG. 2 illustrates a cross-sectional view of a single contact region for the example solar cell of FIG. 1, according to some embodiments.

With reference to FIG. 2, there is shown a single contact region of the solar cell of FIG. 1. In the case where the first metal layer includes metal particles 130 or aluminum particles, the contact resistance can be high due to the porosity of the aluminum particles. The contact location 138 between the aluminum particles and the silicon substrate 110, depicted here, but not limited to, as the first doped region 112, is low, therefore the contact resistance is high. Another observable issue is pits 142 within reacted or damaged regions 140 on the silicon substrate 110, depicted here, but not limited to, as the first doped region 112. The pits 142 can cause breakages or faults within the silicon, increasing the chances for recombination of charges within the bulk silicon and thus degrading the lifetime of a solar cell 100. Current approaches to reduce contact resist can include heating the first metal paste, described above, at higher temperatures. A drawback to high temperature heating is that the aluminum will dissolve silicon from the first and second doped regions 112, 114 causing lifetime degradation to the solar cell 100.

FIGS. 3-6 illustrate cross-sections of methods for forming a contact region on a solar cell. One or more methods are directed to overcoming the limitations discussed above. Details and embodiments are discussed below.

Figure 3:
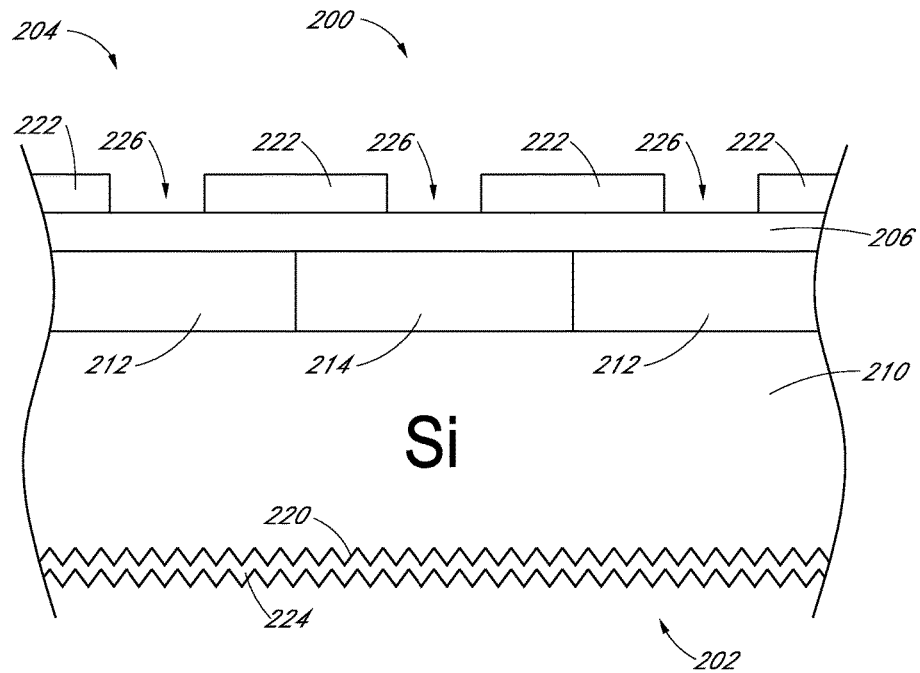
FIGS. 3-5 illustrate cross-sectional views of various operations in forming a contact region on a solar cell, according to some embodiments.

Turning now to FIG. 3, there is shown a step in a method for forming a contact region for a solar cell. The method can include providing a solar cell 200 having a front side 202 which faces the sun during normal operation and a back side 204 opposite the front side 202. The solar cell 200 can include a silicon substrate 210. The solar cell 200 can also include a first and second doped regions 212, 214. The solar cell 200 can also include a polysilicon layer 206 formed over the first and second doped regions 212, 214. In an embodiment, the polysilicon layer 206 is an undoped polysilicon layer. In an embodiment, the polysilicon layer 206 is a doped polysilicon layer. A first dielectric layer 222 can be formed over the polysilicon layer 206. In an embodiment, the first dielectric layer 222 can be a BARC layer. Similar to that mentioned above, the first and second dielectric layer 212, 214 can include silicon nitride. Contact openings 226 can also be formed over the first and second doped regions 212, 214 by any number of lithography processes including wet etching and ablation techniques. The solar cell 200 can also include a texturized surface 220 on the silicon substrate 210, where a second dielectric layer 224 can be formed over the texturized surface 220. In an embodiment, the second dielectric layer 224 can be an ARC layer.

Figure 4:
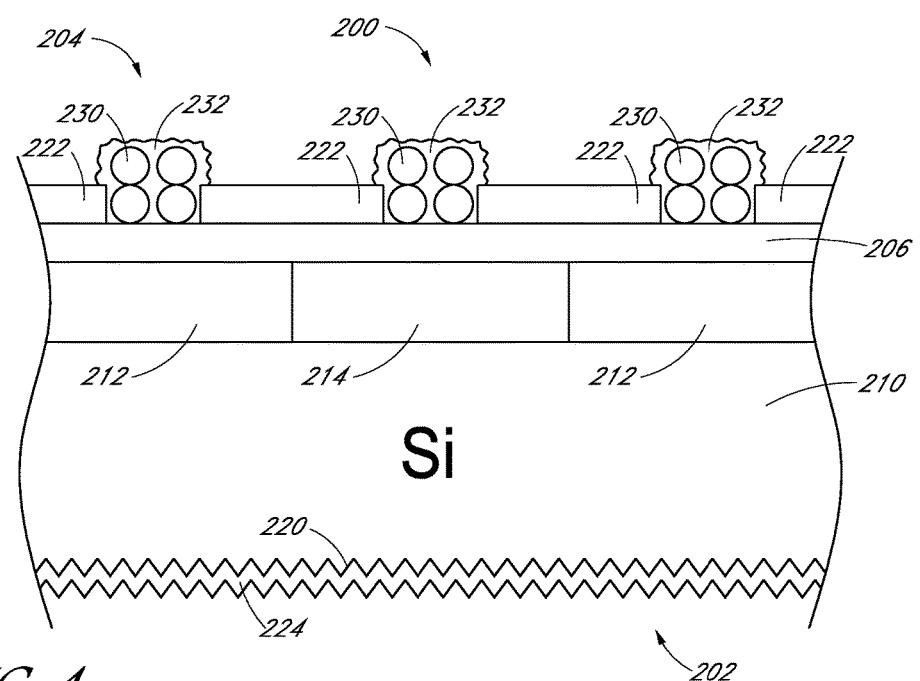

FIG. 4 illustrates another step in a method for forming a contact region for a solar cell, according to some embodiments. The method can include forming a first metal paste or a metal paste that includes metal particles 230 and a cohesive matrix 232 over the contact opening 226. In an embodiment, the first metal paste can be an aluminum paste or some other conductive paste. In an embodiment, the first metal paste can be deposited by a printing process, (e.g., inkjet printing or screen printing).

Figure 5:
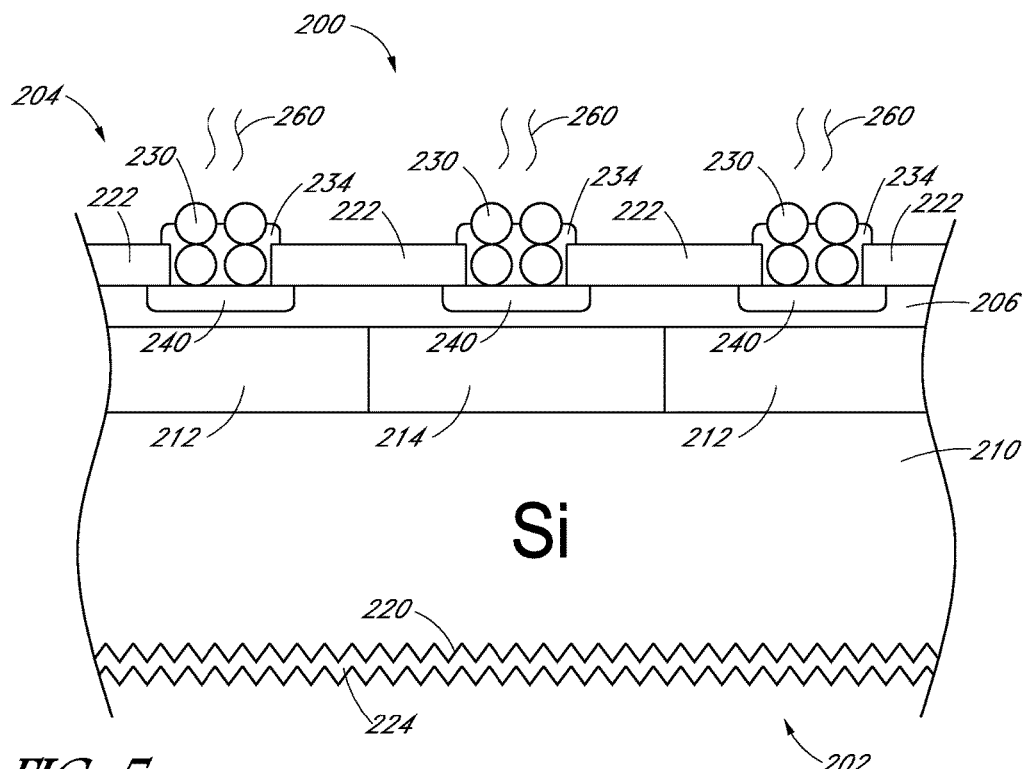
Figure 6:
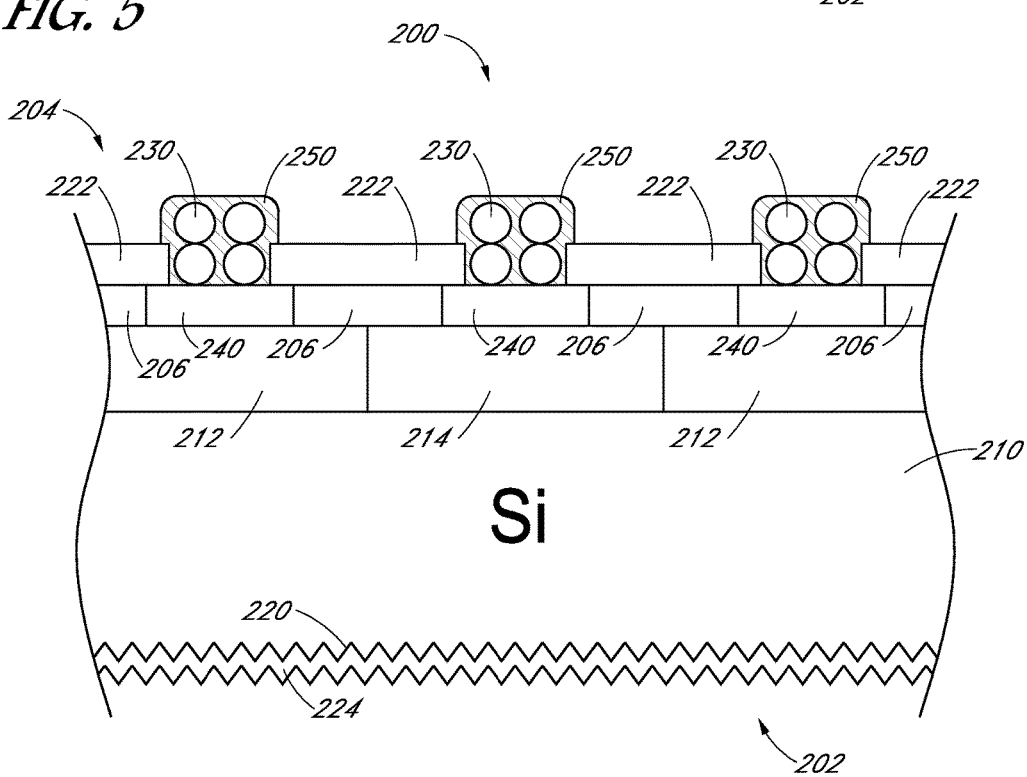
FIG. 6 illustrates a cross-sectional view of another example solar cell, according to some embodiments.

With reference to FIG. 5, there is shown still another step in a method for forming a contact region for a solar cell. The method can include heating 220 the first metal paste, where the heating removes the cohesive matrix 232. In FIG. 5, the cohesive matrix during heating 260 is shown. In an embodiment, heating 260 the first metal paste or aluminum paste includes annealing at a temperature of 550° C. In an embodiment the heating 260 allows the first metal paste to consume the polysilicon layer 206 disposed below the first metal paste forming a conductive filling 240. In FIG. 5, the conductive filling 240 during the heating 260 is shown. In an embodiment, the conductive filling 240 includes aluminum particles, silicon particles and/or aluminum-silicon alloy particles, among other examples. In an embodiment, the conductive filling can be a first alloy (e.g., an aluminum-silicon alloy). In some embodiments, the heating 260 allows the first metal paste or aluminum-silicon alloy particles to adjustably consume the polysilicon layer 206 disposed below the first metal paste. In an embodiment, the conductive filling 240, as shown in FIG. 6 below, can have a thickness in the range of 0.2-1 microns. In some embodiments, the conductive filling 240 can have, but is not limited to, a contact resistivity of less than 10-4 Ohm-cm$^2$. The second metal layer 250 can be formed on the first metal layer using a metallization and/or plating process.

FIG. 6 illustrates yet another step in a method for forming a contact region for a solar cell. In an embodiment, the solar cell can include a first metal layer that includes metal particles 230, and a conductive filling 240 formed between the first metal layer and the first and second doped regions 212, 214. In an embodiment, the first metal layer 230 can be aluminum. In an embodiment, a second metal layer 250 can be formed on the first metal layer, where the first metal layer and the conductive filling 240 provide an electrical connection between the first and second doped regions 212, 214 to the second metal layer 250. In an embodiment, the second metal layer 250 can be copper, tin, aluminum, silver, gold, chromium, iron, nickel, zinc, ruthenium, palladium, and/or platinum, among other examples. The second metal layer 250 can be formed on the second metal layer 250 using a metallization and/or plating process.

Figure 7:
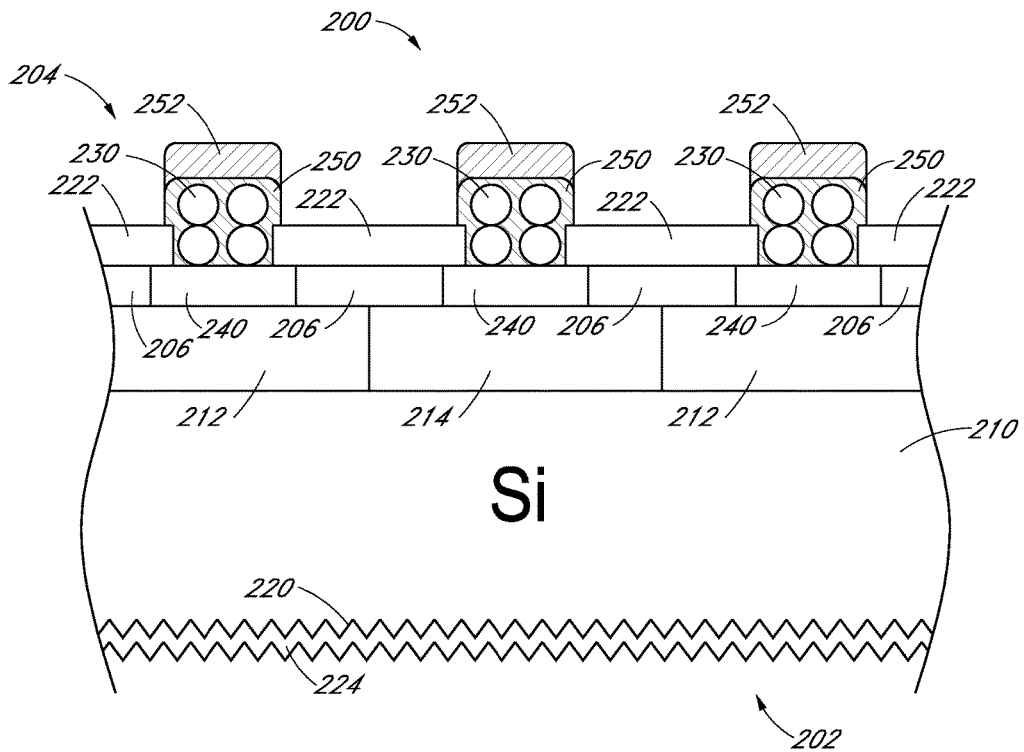
FIG. 7 illustrates a cross-sectional view of still another example solar cell, according to some embodiments.

With reference to FIG. 7, a cross-sectional view of another solar cell is shown. In an embodiment, a third metal layer 252 can be formed on the solar cell 200 of FIG. 6. In an embodiment, the third metal layer 252 can be copper, tin, aluminum, silver, gold, chromium, iron, nickel, zinc, ruthenium, palladium, and/or platinum, among other examples.

Figure 8:
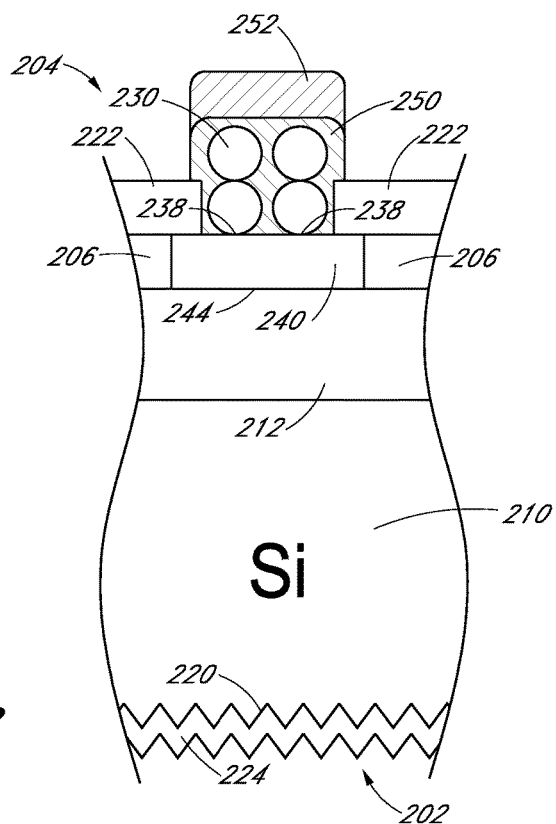
FIG. 8 illustrates a cross-sectional view of a single contact region for the example solar cell of FIG. 7, according to some embodiments.

Turning to FIG. 8, there is shown a single contact region of the solar cell of FIG. 7. In contrast to the total area in electrical connection with the silicon substrate 210, depicted here, but not limited to, as the first doped region 212, between the first contact location 138 of the solar cell of FIG. 2 and a first contact location 244 shown in FIG. 8, the total area in electrical connection with the silicon substrate 210 shown in FIG. 2 is increased. Unlike FIG. 2, FIG. 8 shows a conductive contact 240 formed through or at least partially through a polysilicon layer 206 and between metal particles 230 and the first doped region 212, where the metal particles 230 are in contact with the conductive contact 240 at a second contact location 238. Also in contrast to FIG. 2, the contact resistance between the metal particles 130 of the first metal layer and the silicon substrate 211 is reduced due to the increase in the total area in electrical connection. In an embodiment, pits within the silicon substrate 210 can also be reduced. Therefore the contact regions shown in FIGS. 3-8 can provide for an increased total contact area, reduced contact resistance and reduced silicon substrate 210 pitting.

Figure 9:
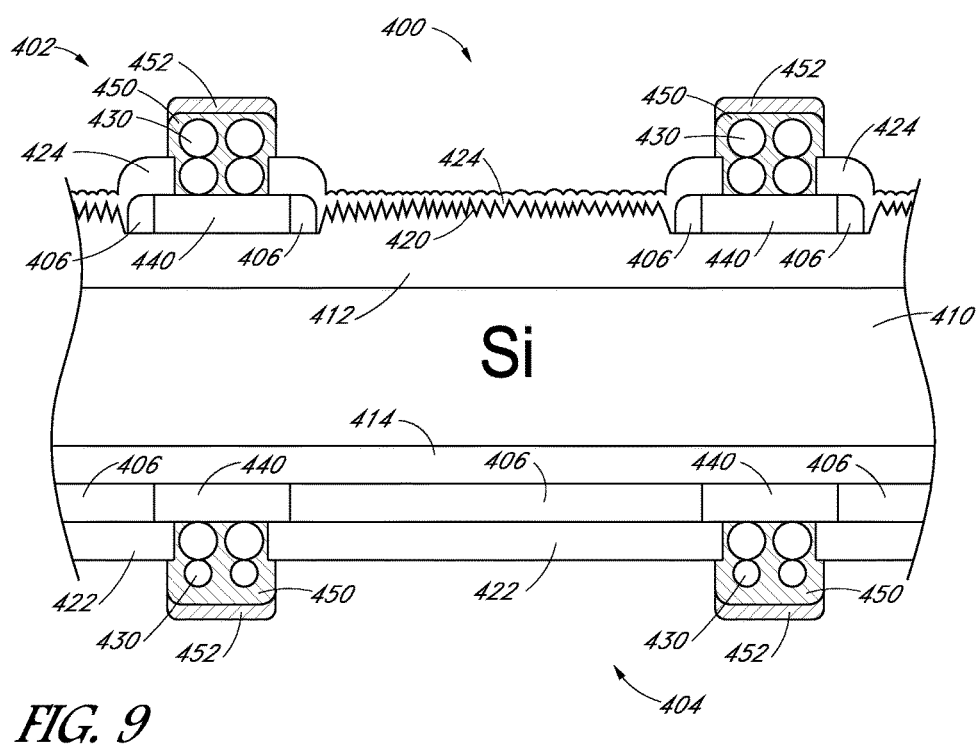
FIG. 9 illustrates a cross-sectional view of various example solar cells, according to some embodiments.

FIG. 9 illustrates still another solar cell 400 having a front side 402 which faces the sun during normal operation and a back side 404 opposite the front side 402, according to some embodiments. The solar cell 400 can include a silicon substrate 410 having a first and second doped regions 412, 414. In an embodiment, the first and second doped regions 412, 414 can be grown by a thermal process. The first and second doped regions 412, 414 can each include a doping material but is not limited to a positive-type dopant such as boron and a negative-type dopant such as phosphorous. A first dielectric layer 422 can be formed over the second doped region 414. A second dielectric layer 424 can be formed over the first doped region 412. The solar cell 400 can include a texturized surface 420 for additional light absorption and a second dielectric layer 424 formed over the texturized surface 420. In an embodiment, the solar cell can include a first metal layer that includes metal particles 430 and a conductive filling 440 formed between the first metal layer and the first and second doped regions 412, 414. In an embodiment, the conductive filling 440 can be formed at least partially through the polysilicon layer 406. In an embodiment, a second metal layer 450 can be formed on the first metal layer, where the first metal layer and the conductive filling 440 provide an electrical connection between the first and second doped regions 412, 414 to the second metal layer 450.

In some embodiments, the solar cell 400 includes a third metal layer 452 formed on the second metal layer 450, where the conductive filling 440, first metal layer and second metal layer 450 provide an electrical connection between the first and second doped regions 412, 414 and the third metal layer 452. In an embodiment, the second and/or third metal layer 450, 452 can be copper, tin, aluminum, silver, gold, chromium, iron, nickel, zinc, ruthenium, palladium, and/or platinum, among others. The second and/or third metal layer 450, 452 can be formed using a plating process.

Figure 10:
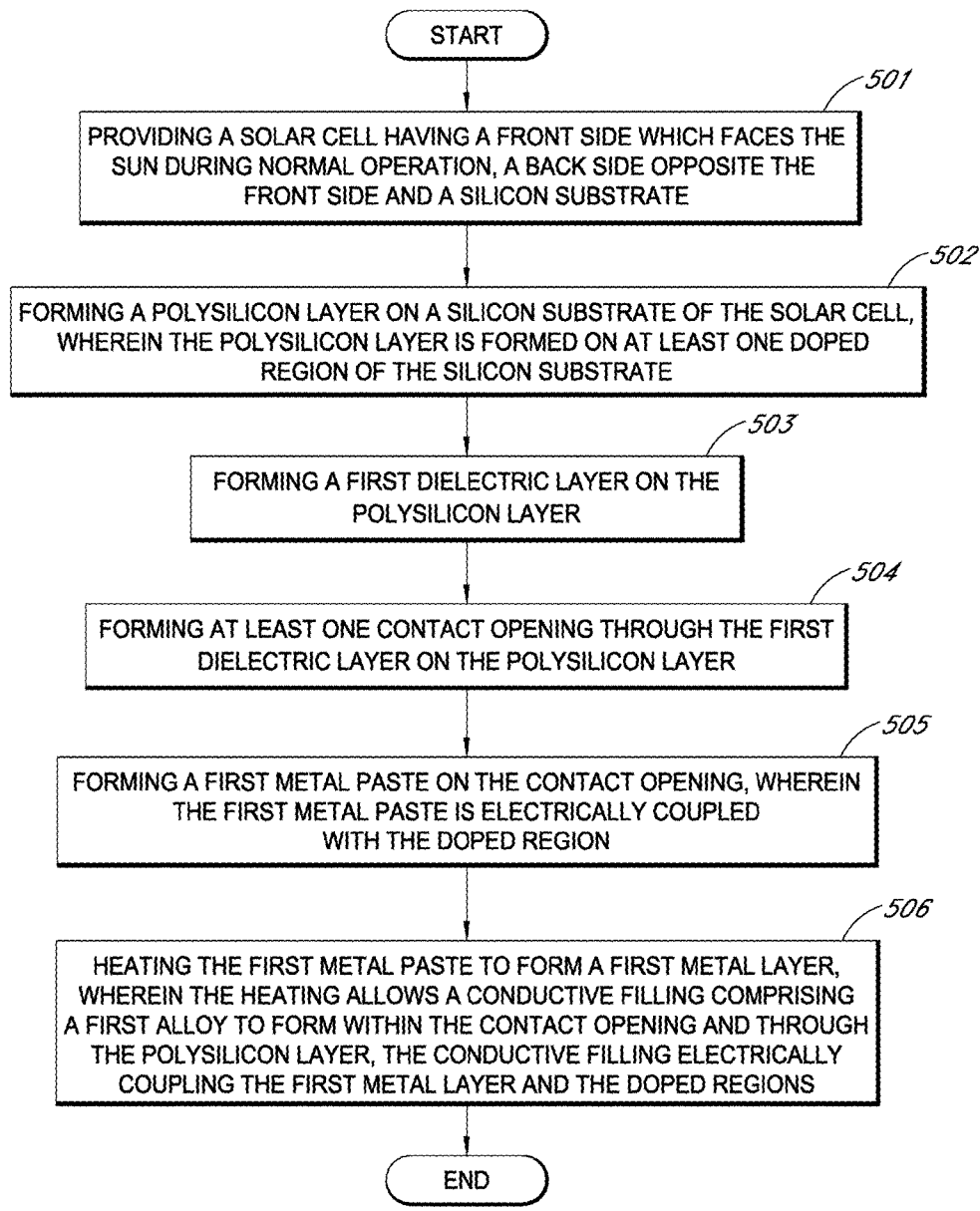
FIGS. 10-11 illustrate a flow chart representation of various example methods for forming contact regions of a solar cell, according to some embodiments.

With reference to FIG. 10, a flow chart illustrating a method for forming a contact region on a solar cell is illustrated.

At 501, the method can include providing a solar cell having a front side which faces the sun during normal operation, a back side opposite the front side and a silicon substrate.

At 502, a polysilicon layer can be formed on a silicon substrate of the solar cell, where the polysilicon layer is formed on at least one doped region of the silicon substrate.

At 503, a first dielectric layer can be formed on the polysilicon layer.

At 504, at least one contact opening can be formed through the first dielectric layer on the polysilicon layer.

At 505, a first metal layer can be formed on the contact opening.

At 506, a the first metal paste can be heated to form a first metal layer, where the heating allows a conductive filling that includes a first alloy to form within the contact opening and through or at least partially through the polysilicon layer, the conductive filing electrically coupling the first metal layer and the doped regions.

Figure 11:
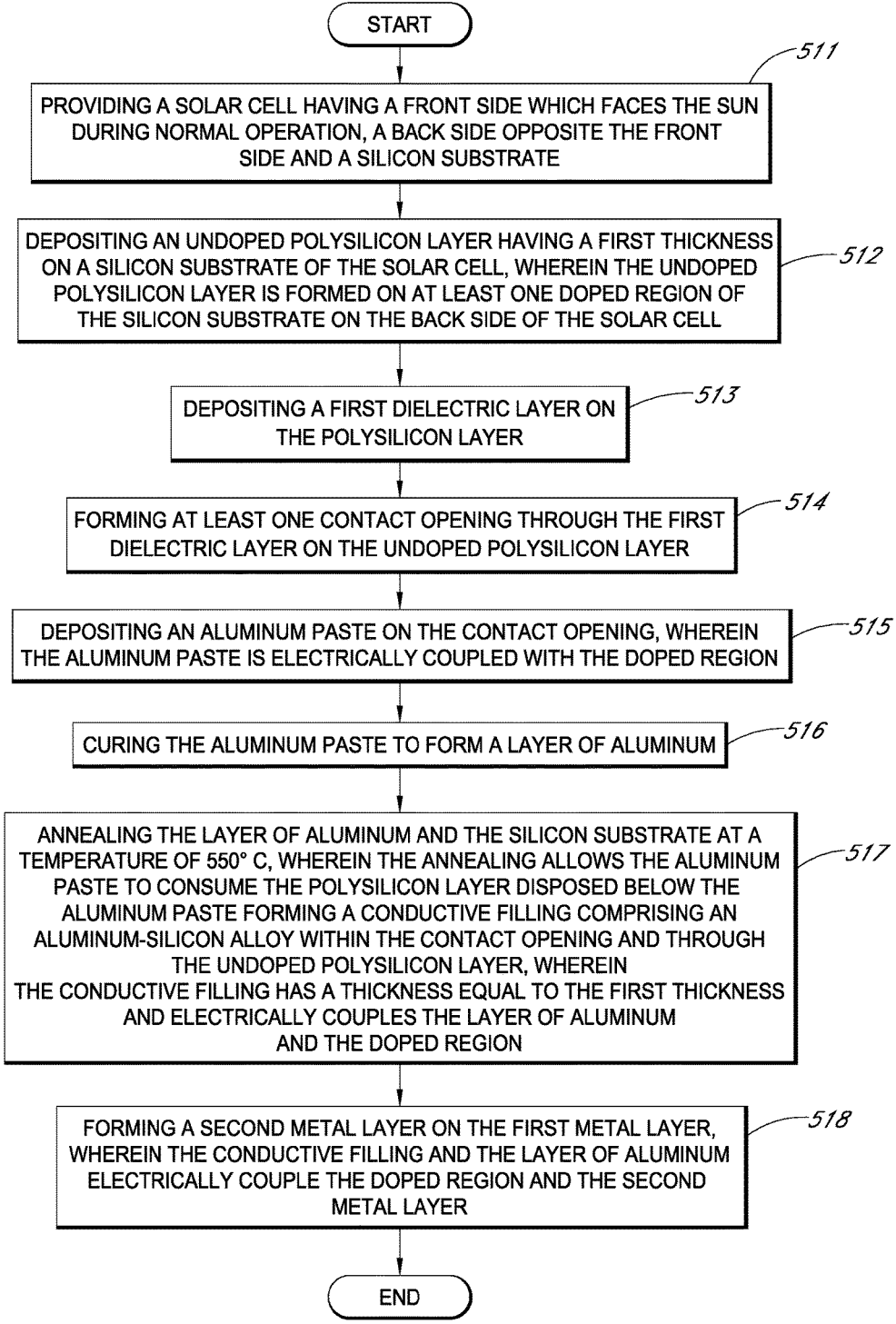

FIG. 11 illustrates a flow chart illustrating another method for forming a contact region on a solar cell.

At 511, the method can include providing a solar cell having a front side which faces the sun during normal operation, a back side opposite the front side and a silicon substrate.

At 512, an undoped polysilicon layer having a first thickness can be deposited on a silicon substrate of the solar cell, where the undoped polysilicon layer can be formed on at least one doped region of the silicon substrate on the back side of the solar cell.

At 513, a first dielectric layer can be deposited on the polysilicon layer.

At 514, at least one contact opening can be formed through the first dielectric layer on the undoped polysilicon layer.

At 515, an aluminum paste can be deposited on the contact opening, where the aluminum paste is electrically coupled with the doped region.

At 516, the aluminum paste can be cured to form a layer of aluminum.

At 517, the layer of aluminum and silicon substrate can be annealed at a temperature of 550° C. to allow the layer of aluminum to consume the polysilicon layer disposed below the layer of aluminum forming a conductive filling. In an embodiment, the conductive filling can include an aluminum-silicon alloy. In an embodiment, the conductive filling can have a thickness equal to the first thickness and electrically couple the layer of aluminum and the doped region.

At 518, a second metal layer can be formed on the first metal layer, where the conductive filling and the layer of aluminum electrically couple the doped region to the second metal layer.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A solar cell, having a front side which faces the sun during normal operation, and a back side opposite the front side, the solar cell comprising:
   a polysilicon layer disposed on a doped region, the polysilicon layer in direct contact with the doped region, wherein the doped region is formed in a silicon substrate, and wherein the silicon substrate comprises material selected from the group consisting of N-type bulk silicon and P-type bulk silicon;
   a first metal layer disposed at least partially on the polysilicon layer, wherein the first metal layer is aligned with the doped region;
   a first dielectric layer formed over the polysilicon layer, wherein at least one contact opening is formed through the first dielectric layer; and
   a conductive filling comprising a first alloy and polysilicon formed below the at least one contact opening and at least partially through the polysilicon layer, wherein the conductive filling electrically couples the first metal layer and the doped region.

2. The solar cell of claim 1, wherein the polysilicon layer is an undoped polysilicon layer.

3. The solar cell of claim 1, wherein the first dielectric layer comprises silicon nitride.

4. The solar cell of claim 1, wherein the doped region comprises a dopant selected from the group consisting of phosphorus and boron.

5. The solar cell of claim 1, wherein the first alloy of the conductive filling comprises aluminum.

6. The solar cell of claim 1, wherein the conductive filling has a thickness in the range of 0.2-1 micron.

7. The solar cell of claim 1, wherein the conductive filling has a contact resistivity of less than 10-4 Ohm-cm$^2$.

8. The solar cell of claim 1, wherein the first metal layer comprises aluminum.

9. The solar cell of claim 1 further comprising a second metal layer disposed on the first metal layer, wherein the first metal layer and the conductive filling electrically couple the second metal layer and the doped region.

10. The solar cell of claim 9, wherein the second metal layer comprises a metal selected from the group consisting of copper, tin, aluminum, silver, gold, chromium, iron, nickel, zinc, ruthenium, palladium, and platinum.

11. A solar cell, having a front side which faces the sun during normal operation, and a back side opposite the front side, the solar cell comprising:
    a silicon substrate having a doped region on the back side of the solar cell;
    an undoped polysilicon layer disposed on the doped region, the undoped polysilicon layer in direct contact with the doped region, wherein the undoped polysilicon has a first thickness;
    aluminum particles disposed at least partially over the undoped polysilicon layer, wherein the aluminum particles are aligned over the doped region;
    at least one contact opening formed through a first dielectric layer;
    a conductive filling comprising an aluminum-silicon alloy formed below the at least one contact opening and through the undoped polysilicon layer, wherein the conductive filling has a thickness equal to the first thickness, a contact resistivity of less than 10-4 Ohm-cm$^2$ and electrically couples the aluminum particles and the doped region; and
    a second metal layer disposed on the aluminum particles, wherein the aluminum particles and the conductive filling electrically couple the second metal layer and the doped region.

12. The solar cell of claim 11, wherein the first thickness is in the range of 0.2-1 microns.

13. The solar cell of claim 11, wherein the second metal layer comprises a metal selected from the group consisting of copper, tin, aluminum, silver, gold, chromium, iron, nickel, zinc, ruthenium, palladium, and platinum.

* * * * *